(12) United States Patent
Jeong et al.

(10) Patent No.: US 12,015,421 B2
(45) Date of Patent: Jun. 18, 2024

(54) TRAINING AND LEARNING MODEL FOR RECOGNIZING ACOUSTIC SIGNAL

(71) Applicant: ELECTRONICS AND TELECOMMUNICATIONS RESEARCH INSTITUTE, Daejeon (KR)

(72) Inventors: Young Ho Jeong, Daejeon (KR); Soo Young Park, Daejeon (KR); Tae Jin Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 328 days.

(21) Appl. No.: 17/484,284

(22) Filed: Sep. 24, 2021

(65) Prior Publication Data

US 2022/0216881 A1    Jul. 7, 2022

(30) Foreign Application Priority Data

Jan. 5, 2021    (KR) ........................ 10-2021-0000904

(51) Int. Cl.
*H03M 1/60*    (2006.01)
*G06N 3/045*   (2023.01)
*G06N 20/20*   (2019.01)

(52) U.S. Cl.
CPC .............. *H03M 1/60* (2013.01); *G06N 3/045* (2023.01); *G06N 20/20* (2019.01)

(58) Field of Classification Search
CPC ........... H03M 1/60; G06N 3/08; G06N 3/045; G06N 20/20; G06N 20/00; G06N 3/02;
(Continued)

(56) References Cited

U.S. PATENT DOCUMENTS 8,249,867 B2    8/2012   Cho et al.
8,515,767 B2    8/2013   Reznik
(Continued)

FOREIGN PATENT DOCUMENTS

JP       2015057630 A  *  3/2015
KR    10-2018-0117704 A    10/2018
KR    10-2020-0115731 A    10/2020

OTHER PUBLICATIONS

Elizalde et al. (Acoustic scene classification and sound event detection in real life recording), Sep. 3, 2016 https://arxiv.org/abs/1607.06706 (Year: 2016).*

(Continued)

*Primary Examiner* — Yogeshkumar Patel
(74) *Attorney, Agent, or Firm* — LRK PATENT LAW FIRM

(57) ABSTRACT

Disclosed are a training method for a learning model for recognizing an acoustic signal, a method of recognizing an acoustic signal using the learning model, and devices for performing the methods. The method of recognizing an acoustic signal using a learning model includes identifying an acoustic signal including an acoustic event or acoustic scene, determining an acoustic feature of the acoustic signal, dividing the determined acoustic feature for each of a plurality of frequency band intervals, and determining the acoustic event or acoustic scene included in the acoustic signal by inputting the divided acoustic features to a trained learning model.

10 Claims, 8 Drawing Sheets

(58) Field of Classification Search
CPC ......... G10L 25/93; G10L 15/02; G10L 15/04; G10L 15/063; G10L 19/02; G10L 25/51; G10L 25/30; G10L 25/18; G10L 25/24
See application file for complete search history.

(56) References Cited

U.S. PATENT DOCUMENTS

| | | |
|---|---|---|
| 9,031,243 B2 | 5/2015 | LeBoeuf et al. |
| 9,378,742 B2 | 6/2016 | Kim |
| 2020/0302949 A1* | 9/2020 | Jeong ................. G10L 17/04 |

OTHER PUBLICATIONS

Sophiya et al. (Large scale data based audio scene classification, 2018 | SpringerLink), Sep. 4, 2018 https://link.springer.com/article/10.1007/s10772-018-9552-3 (Year: 2018).*

Sangwon Suh et al., "Designing Acoustic Scene Classification Models with CNN Variants", DCASE 2020, Jul. 1, 2020.

Jie Xie, et al., "Investigation of acoustic and visual features for acoustic scene classification", Expert Systems with Applications 126, 2019.

Mark D. McDonnell, et al., "Acoustic Scene Classification Using Deep Residual Networks With Late Fusion of Separated High and Low Frequency Paths", DCASE2019, 2019.

Sangwon Suh, et al., "Acoustic Scene Classification Using SpecAugment and Convolutional Neural Network with Inception Modules", Proceedings of the DCASE2019 Challenge, New York, NY, USA, 2019.

* cited by examiner ure Invention

TRAINING AND LEARNING MODEL FOR RECOGNIZING ACOUSTIC SIGNAL

CROSS-REFERENCE TO RELATED APPLICATION

This application claims the benefit of Korean Patent Application No. 10-2021-0000904 filed on Jan. 5, 2021, in the Korean Intellectual Property Office, the entire disclosure of which is incorporated herein by reference for all purposes.

BACKGROUND

1. Field of the Invention

One or more example embodiments relate to a training method for a learning model for recognizing an acoustic signal, a method of recognizing an acoustic signal using the learning model, and devices for performing the methods, and more particularly, to technology for accurately recognizing an acoustic signal in various environments by determining acoustic features of the acoustic signal and unequally dividing the acoustic signal, in training a learning model for recognizing an acoustic event or an acoustic scene in an acoustic signal.

2. Description of Related Art

Acoustic recognition technology may be divided into acoustic event recognition and acoustic scene recognition depending on a target to be recognized. An acoustic event refers to an acoustic object that appears and disappears at a specific time, such as a siren sound or a vehicle horn sound, and an acoustic scene is a unique spatial acoustic characteristic by a combination of acoustic events that may occur in a specific place such as an airport, a subway station, a library, etc.

Recently, research using deep learning in recognizing an acoustic event or acoustic scene in an acoustic signal has been actively conducted. Acoustic signals used as training data for training a learning model that determines or classifies an acoustic event or acoustic scene in an acoustic signal are data collected using only one or two specific microphones or specific devices (such as mobile phones).

However, since various microphones and devices used in the real environment have characteristics (polar pattern, frequency response, frequency range, sensitivity, etc.) and audio processing characteristics (sampling frequency, internal noise, etc.), the learning model may not be suitable for the real environment.

Therefore, to solve the foregoing, technology for training a learning model based on an acoustic feature for each frequency domain is needed as a method of generalizing a learning model.

SUMMARY

Example embodiments provide a method and device for training a learning model that recognizes an acoustic signal not to degrade the performance of the learning model even in various real device environments and a method and device for recognizing an acoustic signal using the learning model.

According to an aspect, there is provided a method of recognizing an acoustic signal using a learning model, the method including identifying an acoustic signal including an acoustic event or acoustic scene, determining an acoustic feature of the acoustic signal, dividing the determined acoustic feature for each of a plurality of frequency band intervals, and determining the acoustic event or acoustic scene included in the acoustic signal by inputting the divided acoustic features to a trained learning model.

The determining of the acoustic feature may include converting the acoustic signal into a frequency domain, and generating log Mel-filterbank energy based on the converted acoustic signal.

The trained learning model may include a combinational model and a plurality of neural network models, wherein each of the neural network models may be trained to determine an acoustic event or acoustic scene included in the divided acoustic feature, and the combinational model may be configured to combine output results of the plurality of neural network models.

The dividing may include dividing the acoustic feature into frequency band intervals of different lengths based on a frequency axis of the acoustic feature.

According to an aspect, there is provided a method of training a learning model for recognizing an acoustic signal, the method including identifying an acoustic signal including an acoustic event or acoustic scene and a label representing the acoustic event or acoustic scene included in the acoustic signal, determining an acoustic feature of the acoustic signal, dividing the determined acoustic feature for each of a plurality of frequency band intervals, and training the learning model using the acoustic feature divided by each of the plurality of frequency band intervals and the label.

The determining of the acoustic feature may include converting the acoustic signal into a frequency domain, and generating log Mel-filterbank energy based on the converted acoustic signal.

The trained learning model may include a combinational model and a plurality of neural network models, wherein each of the neural network models may be trained to determine an acoustic event or acoustic scene included in the divided acoustic feature, and the combinational model may be configured to combine output results of the plurality of neural network models.

The dividing may include dividing the acoustic feature into frequency band intervals of different lengths based on a frequency axis of the acoustic feature.

The training of the learning model may include obtaining an output signal in which the acoustic event or acoustic scene is determined from the learning model by inputting the divided acoustic signal to the learning model, and updating weights of the learning model according to a difference between the output signal and the label.

According to an aspect, there is provided a recognition device for performing a method of recognizing an acoustic signal, the recognition device including a processor, wherein the processor may be configured to identify an acoustic signal including an acoustic event or acoustic scene, determine an acoustic feature of the acoustic signal, divide the determined acoustic feature for each of a plurality of frequency band intervals, and determine the acoustic event or acoustic scene included in the acoustic signal by inputting the divided acoustic features to a trained learning model.

The processor may be further configured to convert the acoustic signal into a frequency domain, and generate log Mel-filterbank energy based on the converted acoustic signal.

The trained learning model may include a combinational model and a plurality of neural network models, wherein each of the neural network models may be trained to determine an acoustic event or acoustic scene included in the divided acoustic feature, and the combinational model may be configured to combine output results of the plurality of neural network models.

The processor may be further configured to divide the acoustic feature into frequency band intervals of different lengths based on a frequency axis of the acoustic feature.

According to an aspect, there is provided a training device for performing a method of training a learning model, the training device including a processor, wherein the processor may be configured to identify an acoustic signal including an acoustic event or acoustic scene and a label representing the acoustic event or acoustic scene included in the acoustic signal, determine an acoustic feature of the acoustic signal, divide the determined acoustic feature for each of a plurality of frequency band intervals, and train the learning model using the acoustic feature divided for each of the plurality of frequency band intervals and the label.

The processor may be further configured to convert the acoustic signal into a frequency domain, and generate log Mel-filterbank energy based on the converted acoustic signal.

The trained learning model may include a combinational model and a plurality of neural network models, wherein each of the neural network models may be trained to determine an acoustic event or acoustic scene included in the divided acoustic feature, and the combinational model may be configured to combine output results of the plurality of neural network models.

The processor may be further configured to divide the acoustic feature into frequency band intervals of different lengths based on a frequency axis of the acoustic feature.

The processor may be further configured to obtain an output signal in which the acoustic event or acoustic scene is determined from the learning model by inputting the divided acoustic signal to the learning model, and update weights of the learning model according to a difference between the output signal and the label.

Additional aspects of example embodiments will be set forth in part in the description which follows and, in part, will be apparent from the description, or may be learned by practice of the disclosure.

According to example embodiments, it is possible to train a learning model that recognizes an acoustic signal not to degrade the performance of the learning model even in various real device environments, and recognize an acoustic signal using the learning model.

The methods according to the example embodiments are applicable to various application fields such as avoidance of danger, facility security monitoring, media automatic tagging, situational awareness, environmental noise monitoring, and equipment condition monitoring for the elderly and infirm, hearing impaired, and smart cars.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
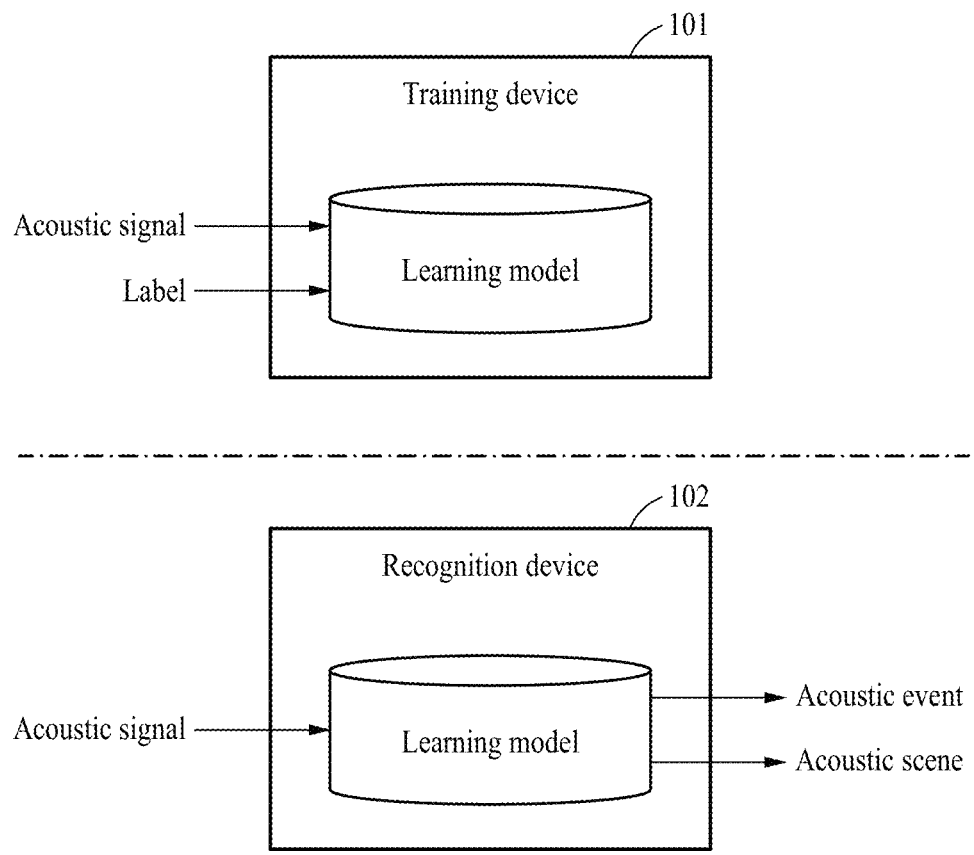
FIG. 1 is a diagram illustrating a structure of a training device and a recognition device according to an example embodiment.

Hereinafter, example embodiments will be described in detail with reference to the accompanying drawings. However, various alterations and modifications may be made to the example embodiments. Here, the example embodiments are not construed as limited to the disclosure. The example embodiments should be understood to include all changes, equivalents, and replacements within the idea and the technical scope of the disclosure.

The terminology used herein is for the purpose of describing particular example embodiments only and is not to be limiting of the example embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

FIG. 1 is a diagram illustrating a structure of a training device 101 and a recognition device 102 according to an example embodiment.

The present disclosure relates to technology for recognizing an acoustic event or acoustic scene in an acoustic signal. The present disclosure may recognize an acoustic event or acoustic scene included in an acoustic signal using a learning model to which deep learning is applied.

The present disclosure provides, in training learning models, a method of unequally dividing an acoustic signal, and training and combining respective learning models using acoustic features of the divided acoustic signal, thereby achieving a high performance in various microphone environments.

A device for recognizing an acoustic signal, hereinafter, the recognition device 102, may be a device including a processor, such as a desktop computer or a laptop computer. The processor included in the recognition device 102 may perform a recognition method provided herein. In addition, the training device 101 may be a device including a processor, such as a desktop computer or a laptop computer. The training device 101 may perform a method of training a learning model used herein. The training device 101 and the recognition device 102 may correspond to the same processor.

The learning model is a model to which deep learning is applied, and includes a plurality of layers having weights. As an example, the learning model may include an input layer, hidden layers, and an output layer. As an example, the learning model may be a convolutional neural network (CNN) model. Herein, the learning model is not limited to a predetermined model. Training of the learning model may refer to a process of updating weights of the learning model to minimize the value of a loss function.

Herein, the learning model may include a combinational model and a plurality of neural network models. The structure of the learning model will be described later with reference to FIG. 6B. The plurality of neural network models are trained with an acoustic feature divided into different frequency band intervals, and the combinational model combines output results of the plurality of neural network models and determines a final output signal of the learning model.

Herein, the learning model may generate an output signal in which the acoustic event or acoustic scene is determined from the acoustic signal. That is, the output signal refers to data in which the acoustic event or acoustic scene is determined for each time window of the acoustic signal.

Referring to FIG. 1, the training device 101 trains a learning model based on an acoustic signal and a label. In this case, the training device 101 determines an acoustic feature in the acoustic signal, and divides the acoustic feature for each of a plurality of frequency band intervals.

Specifically, the training device 101 inputs the divided acoustic features to separate neural network models, and generates a final output signal by combining output results of the respective neural network models using the combinational model. Then, the training device 101 trains the learning model by comparing the final output signal with the label.

That is, since the learning model of the present disclosure is trained with the acoustic feature divided for each frequency band interval, the performance may not degrade even if an environment where an acoustic signal is collected changes.

Referring to FIG. 1, the recognition device 102 determines an acoustic event or acoustic scene by recognizing the acoustic signal using the trained learning model. The recognition device 102 determines an acoustic feature from the acoustic signal, and obtains the acoustic event included in the acoustic signal by inputting the acoustic feature divided for each frequency band interval to the trained learning model.

Figure 2:
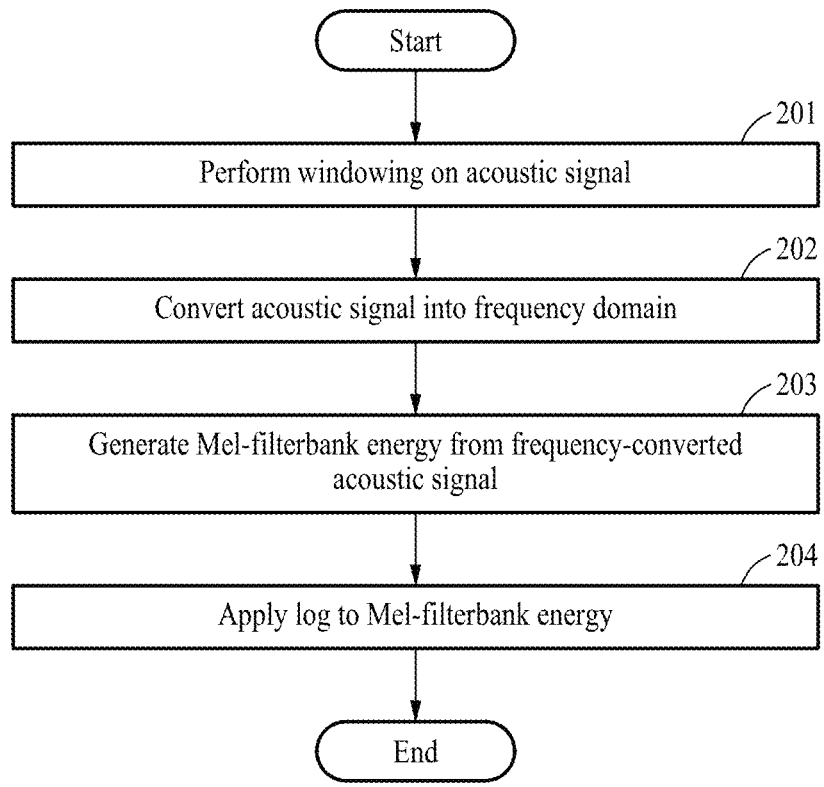
FIG. 2 is a flowchart illustrating a process of extracting an acoustic feature from an acoustic signal according to an example embodiment.

FIG. 2 is a flowchart illustrating a process of determining an acoustic feature from an acoustic signal according to an example embodiment.

The process of determining the acoustic feature may be performed in a method of recognizing an acoustic signal and a process of training a learning model. The method of determining the acoustic feature is not limited to a specific example embodiment. The following process is an example of determining an acoustic feature.

In operation 201, a recognition device or a training device performs windowing on an acoustic signal. That is, the recognition device or the training device divides the acoustic signal into windows of a predetermined length.

In this case, as the length of the windows increases, the frequency resolution may increase, and the time resolution may decrease. Conversely, as the length of the windows decreases, the frequency resolution may decrease, and the time resolution may increase.

In operation 202, the recognition device or the training device converts the acoustic signal into a frequency domain. The conversion to the frequency domain may be processed on a window-by-window basis. For example, the conversion to the frequency domain may be performed using discrete Fourier transform (DFT). The conversion to the frequency domain based on short-time Fourier transform (STFT) is performed according to Equation 1 below.

$$S_{lin}(f, t) = \left| \sum_{n=0}^{N-1} x_t[n]w[n]e^{-i2\pi \frac{f}{f_s}n} \right| \quad \text{[Equation 1]}$$

In Equation 1, f denotes a frequency axis, and t denotes a time axis. $f_s$ denotes a sampling frequency of the acoustic signal, and $S_{lin}$ denotes a spectral magnitude. x and w denote the acoustic signal and a window function, respectively. N is an FFT size and denotes the total length of the windowed acoustic signal.

In operation 203, the recognition device or the training device may generate Mel-filterbank energy from the acoustic signal converted into the frequency domain. As an example, a Mel filterbank may be configured according to Equations 2 and 3 below.

$$f_{mel} = 2595 * \log(1 + f/700) \quad \text{[Equation 2]}$$

$$H_m(k) = \begin{cases} 0 & k < f(m-1) \\ \dfrac{k - f(m-1)}{f(m) - f(m-1)} & f(m-1) \le k < f(m) \\ 1 & k = f(m) \\ \dfrac{f(m+1) - k}{f(m+1) - f(m)} & f(m) < k \le f(m+1) \\ 0 & k > f(m-1) \end{cases} \quad \text{[Equation 3]}$$

Equation 2 is an equation for converting f (in hertz (Hz)) having a linear frequency scale into $f_{mel}$ (in mels) having a nonlinear Mel scale. Equation 3 represents a triangular filterbank, defining gain characteristics of individual filters. In Equation 3, m denotes an index of a triangular filter in the Mel filterbank (m=1 to 128), and f(m) denotes a center frequency of an m-th triangular filter. k denotes a predetermined frequency value.

As an example, the recognition device or the training device may generate Mel-filterbank energy from a power spectrum of the converted acoustic signal using the Mel-filterbank generated based on Equations 2 and 3. As an example, the Mel-filterbank energy may be generated by applying the individual filter $H_m(k)$ of Equation 3 to the spectral magnitude $S_{lin}$ determined in Equation 1.

In operation 204, the recognition device or the training device may determine the log Mel-filterbank energy based on a nonlinear frequency axis by applying a log to the Mel-filterbank energy.

Figure 3A:
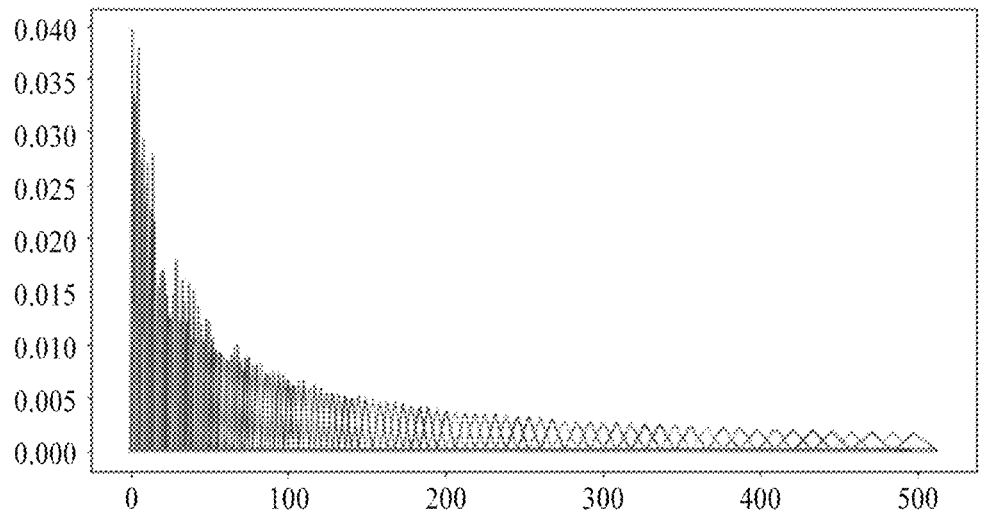
FIGS. 3A and 3B illustrate examples of acoustic features according to an example embodiment.
Figure 3B:
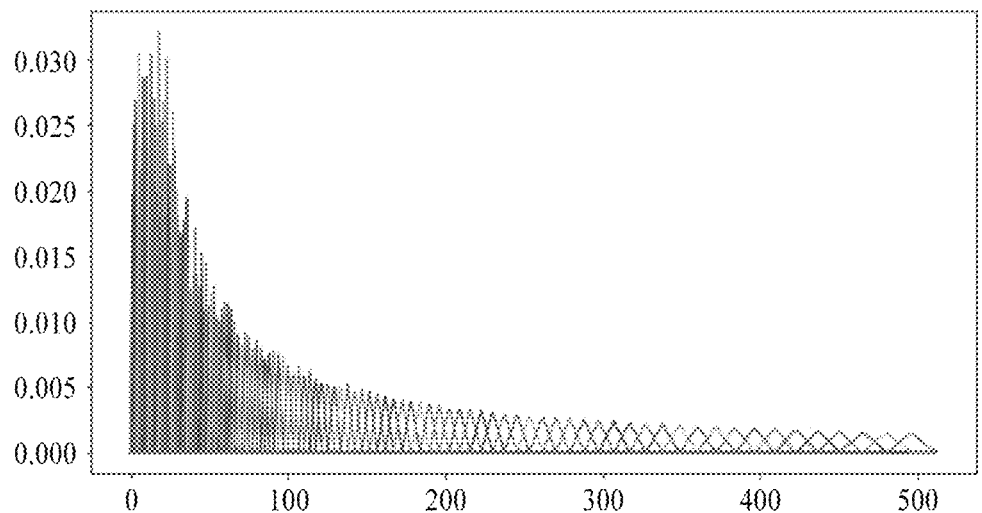

FIGS. 3A and 3B illustrate examples of acoustic features according to an example embodiment.

FIG. 3A illustrates a Mel-filterbank to which the structure proposed in Auditory Toolkit is applied, and FIG. 3B illustrates a Mel-filterbank to which the structure proposed in Mel-Hidden Markov Model ToolKit (HTK) is applied.

The graphs shown in FIGS. 3A and 3B may show 128 Mel scale-based triangular filters to be applied to 1024 signals transformed by DFT (where the horizontal axis denotes 512 linear frequency axes). Referring to FIGS. 3A and 3B, the width of the individual triangular filters decreases as the value of the horizontal axis is close to "0" and increases as the value of the horizontal axis increases.

The Mel filterbanks shown in FIGS. 3A and 3B are represented by normalizing the areas of the triangular filters to "1".

FIG. 3A shows a Mel filterbank in which the triangular filters are arranged in equal width based on the Mel scale in a low frequency band and in increased width in the subsequent band. FIG. 3B shows a Mel filterbank in which the width of triangular filters gradually increases from a low frequency band.

Accordingly, the Mel filterbanks of FIGS. 3A and 3B may differ in recognition performance due to the difference in the width of triangular filters according to the characteristics of the acoustic signal in a low frequency band. When the type of a Mel filterbank used to determine the acoustic feature of the acoustic signal is changed, a new Mel filterbank may be used by adjusting a ratio of dividing the acoustic feature.

Figure 4:
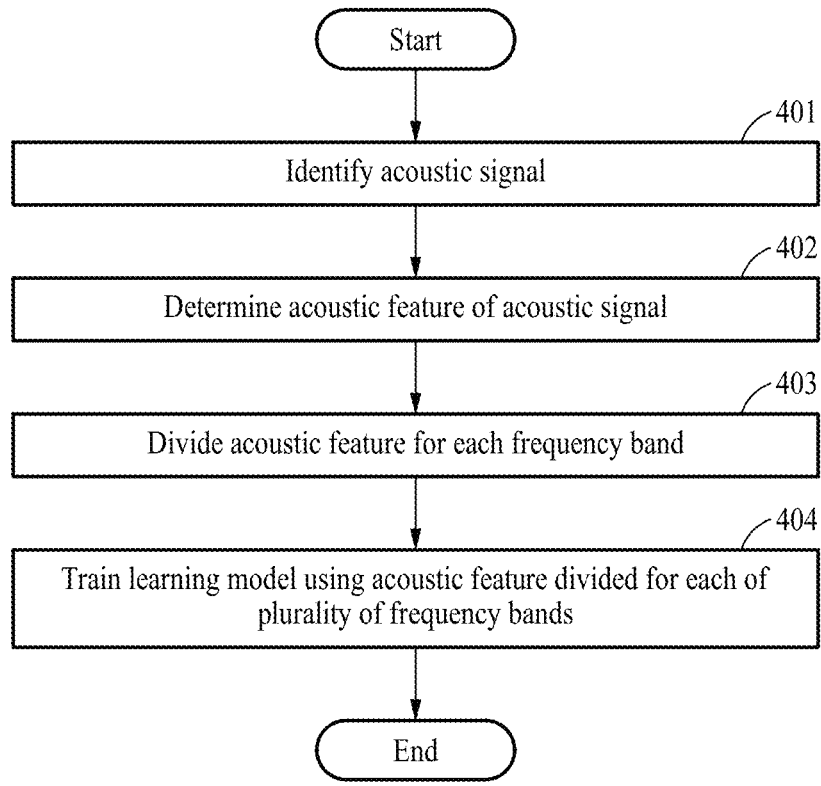
FIG. 4 is a flowchart illustrating a method of training a learning model according to an example embodiment.

FIG. 4 is a flowchart illustrating a method of training a learning model according to an example embodiment.

In operation 401, a training device may identify an acoustic signal including an acoustic event or acoustic scene. The acoustic signal may be divided into a plurality of windows, and the training device may process the acoustic signal on a window-by-window basis.

In operation 402, the training device may determine an acoustic feature of the acoustic signal. The acoustic feature may be determined according to the method described with reference to FIG. 2. In operation 403, the training device may divide the acoustic feature for each frequency band interval.

For example, the training device may divide the acoustic feature for each of a plurality of frequency band intervals, based on human auditory perception characteristics of being insensitive to high-frequency acoustic signals and sensitively responding to low-frequency acoustic signals.

Specifically, the training device may divide the acoustic feature as a long frequency band interval with respect to a relatively high frequency and divide the acoustic feature as a short frequency band interval with respect to a relatively low frequency. The training device may determine a division number and a division ratio in advance, and divide the acoustic feature into the plurality of frequency band intervals based on the predetermined division number and division ratio.

For example, the training device may divide the acoustic feature into the plurality of frequency band intervals according to the division ratio, and may additionally divide the acoustic feature based on the division number. In this case, the additional division process is performed for a lowest frequency band interval of the frequency band intervals. A detailed example of the division process is shown in FIG. 5.

The training device may divide the acoustic feature into frequency band intervals of different lengths based on a frequency axis of the acoustic feature. In operation 404, the training device may train a learning model using the acoustic feature divided for each of the plurality of frequency band intervals.

The learning model includes a combinational model and a plurality of neural network models, wherein each of the neural network models is trained to determine an acoustic event or acoustic scene included in the divided acoustic feature, and the combinational model combines output results of the plurality of neural network models.

That is, the neural network models learn about acoustic features corresponding to different frequency band intervals. Then, the combinational model is trained to generate a final output signal by connecting the output results of the neural network models.

Specifically, the training device obtains the output signal in which the acoustic event or acoustic scene is determined from the learning model by inputting the divided acoustic signal to the learning model. Then, the training device trains the learning model by updating weights of the neural network models and the combinational model included in the learning model according to a difference between the output signal and the label.

Figure 5A:
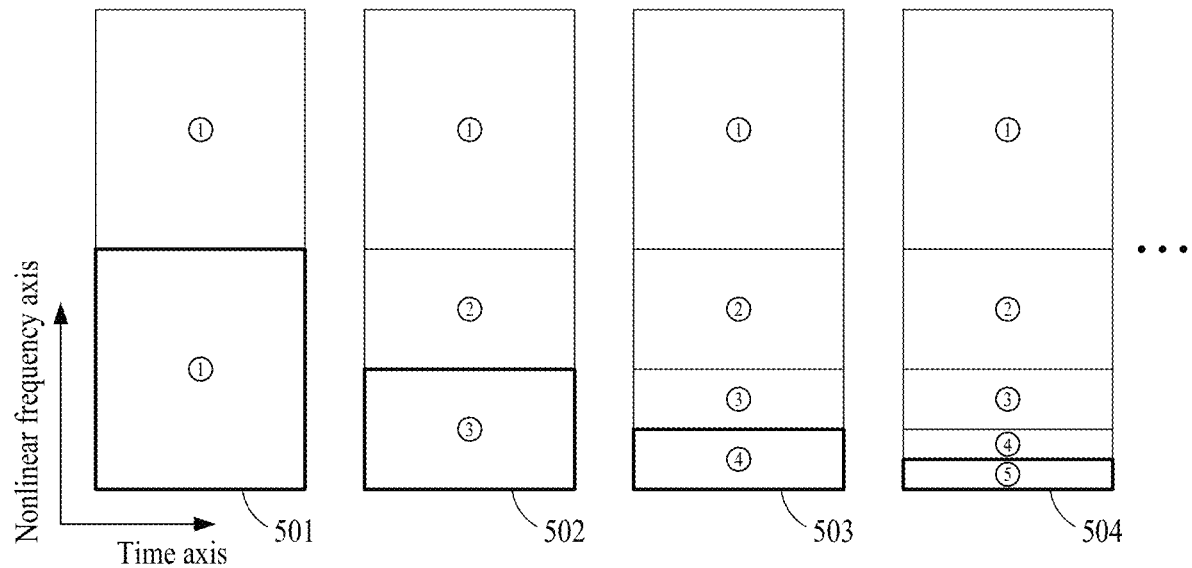
FIGS. 5A to 5C illustrate examples of dividing an acoustic feature according to an example embodiment.
Figures 5B, 5C:
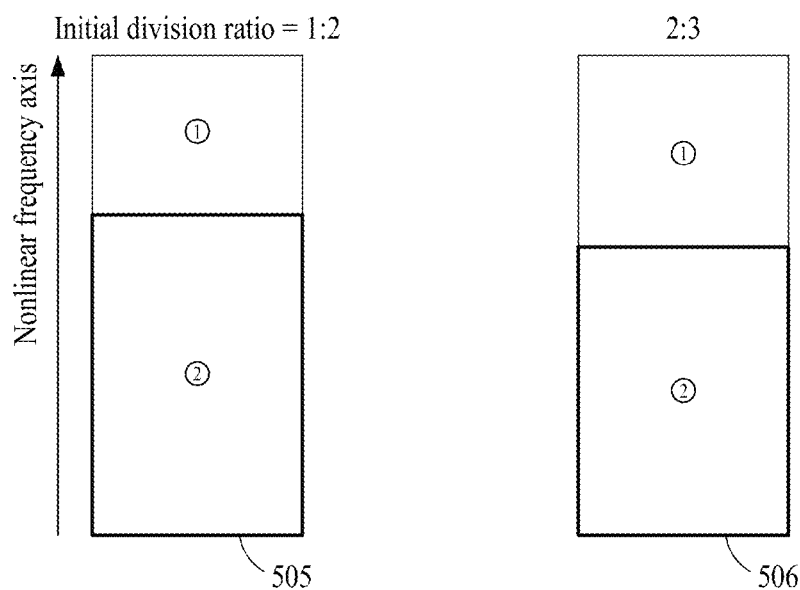

FIGS. 5A to 5C illustrate examples of dividing an acoustic feature according to an example embodiment.

FIG. 5A sequentially illustrates a process of a training device or a recognition device dividing an acoustic feature into a plurality of frequency band intervals when a division ratio is determined to be 1:1 and a division number is determined to be greater than or equal to "5". Acoustic features 501 to 506 may be expressed by a time axis and a nonlinear frequency axis.

Referring to FIG. 5A, the recognition device or the training device divides an acoustic feature at least four times because the division number is greater than or equal to "5". In an initial division process, the recognition device or the training device may divide an acoustic feature into frequency band intervals having a length in 1:1 ratio on the nonlinear frequency axis.

In a subsequent division process, the recognition device or the training device divides the acoustic feature according to the division ratio for a low frequency band interval 501. Similarly, in a subsequent division process, the recognition device or the training device may divide the acoustic feature according to the division ratio for lowest frequency band intervals 502 to 504.

FIG. 5B illustrates an example of dividing an acoustic feature when a division ratio is 1:2, and FIG. 5C illustrates an example of dividing an acoustic feature when a division ratio is 2:3.

In the cases of FIGS. 5B and 5C as well, the recognition device or the training device may divide the acoustic features according to the division ratios for lowest frequency band intervals 505 and 506.

Accordingly, the recognition device or the training device may unequally divide an acoustic feature so that a high frequency band interval is relatively long and a low frequency band interval is relatively short.

Figures 6A, 6B:
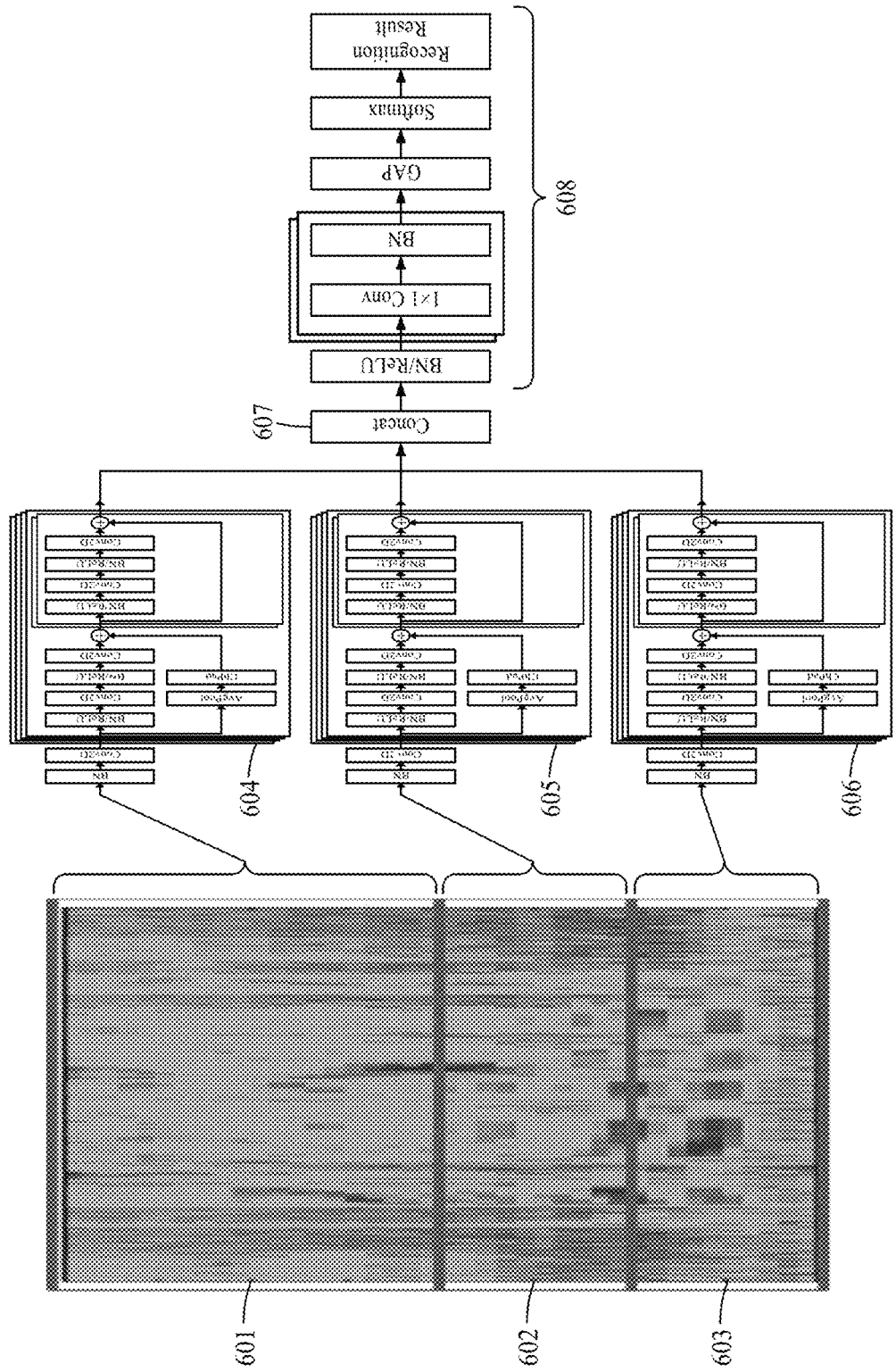
FIGS. 6A and 6B illustrate a divided acoustic feature and a structure of a learning model according to an example embodiment.

FIGS. 6A and 6B illustrate a divided acoustic feature and a structure of a learning model according to an example embodiment.

FIG. 6A illustrates an example of an acoustic feature divided into a plurality of frequency band intervals. FIG. 6B illustrates a structure of a learning model used herein. Referring to FIG. 6B, the learning model may include a plurality of neural network models 604 to 606 and combinational models 607 and 608.

In FIG. 6A, an acoustic feature may be divided into an acoustic feature 601 corresponding to a high frequency band interval, an acoustic feature 602 corresponding to an intermediate frequency band interval, and an acoustic feature 603 corresponding to a low frequency band interval. In addition, the acoustic features 601 to 603 divided as respective frequency band intervals may be input to respective neural network models 604 to 606.

Then, the training device may combine output results of the neural network models 604 to 606. As an example, the training device may combine the output results of the neural network models 604 to 606 through concatenation 607 to the combinational model.

Then, the training device may train the learning model by updating weights of the learning model so as to minimize a value of a loss function determined by comparing a final output signal of the combinational model with a label.

Figure 7:
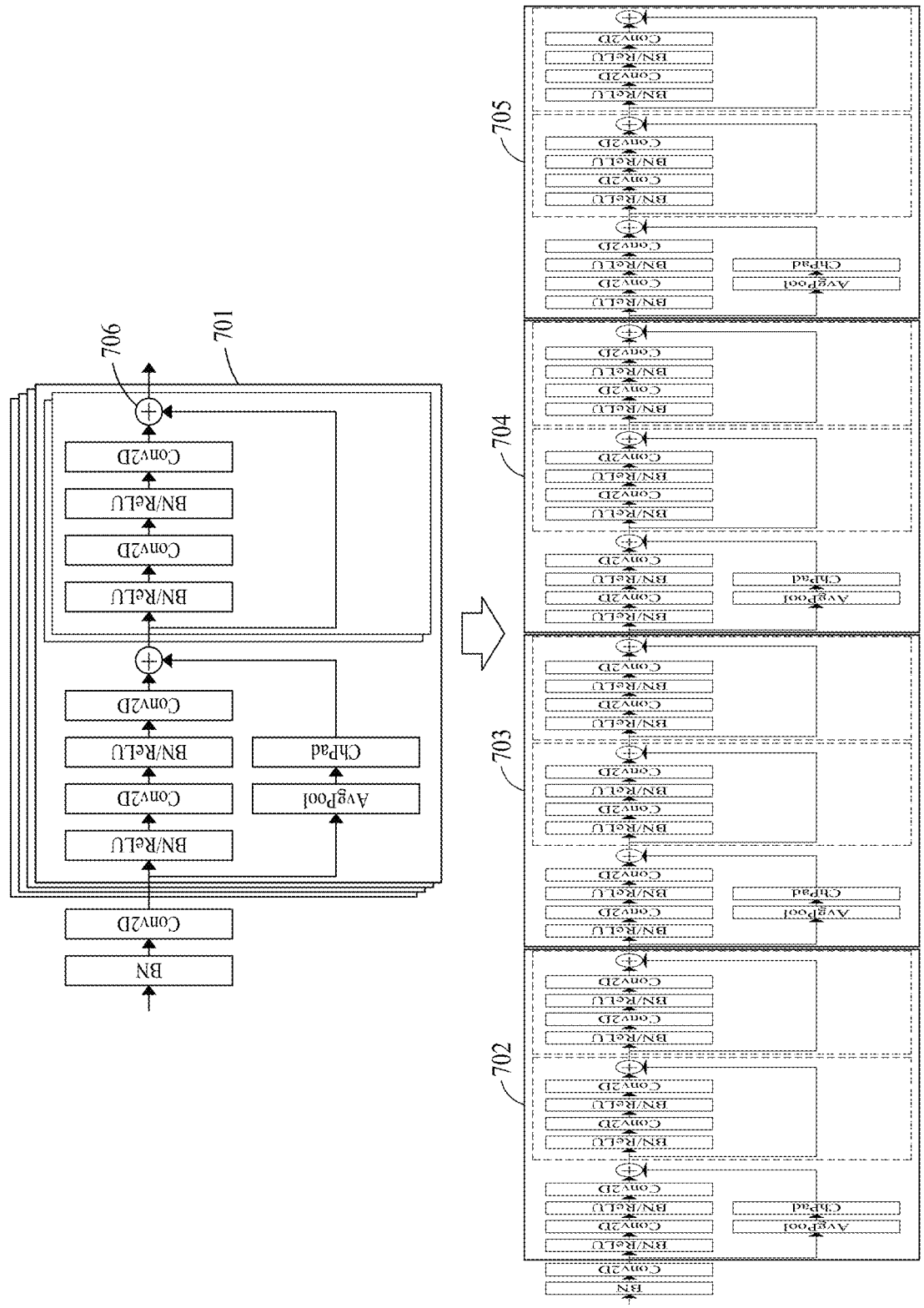
FIG. 7 illustrates a structure of a neural network model according to an example embodiment.

FIG. 7 illustrates a structure of a neural network model according to an example embodiment.

FIG. 7 shows a single neural network model including a plurality of layers 701 to 705. Detailed configurations of the layers 701 to 705 may be configurations of layers 701 to 705 of a general CNN.

However, referring to FIG. 7, a single neural network model is provided in a structure including multiple layers 701 to 705 and having a skip connection 706 in each of the layers 701 to 705 for easy learning.

In addition, the layers 701 to 705 of the neural network model may be applied with a kernel structure having a kernel (filter) stride and dilation of an integer multiple with respect to a time axis or frequency axis, and have a wide receiving area.

Figure 8:
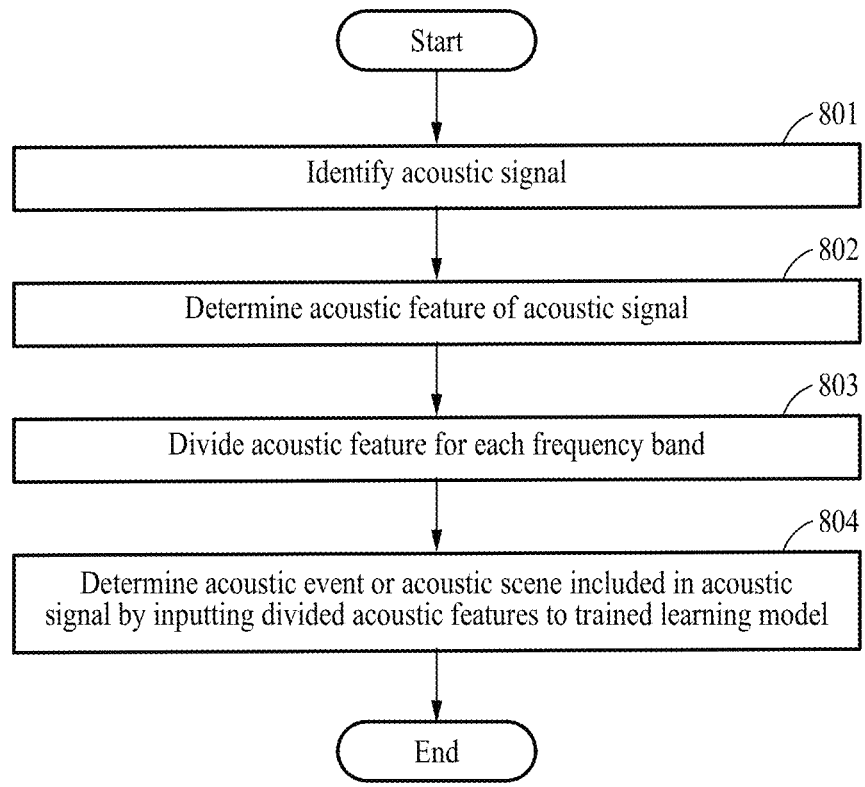
FIG. 8 is a flowchart illustrating a method of recognizing an acoustic signal using a learning model according to an example embodiment.

FIG. 8 is a flowchart illustrating a method of recognizing an acoustic signal using a learning model according to an example embodiment.

In operation 801, a recognition device may identify an acoustic signal. The acoustic signal may include an acoustic event or acoustic scene. The acoustic signal may be divided into a plurality of windows, and the recognition device may process the acoustic signal on a window-by-window basis.

In operation 802, the recognition device may determine an acoustic feature of the acoustic signal. The acoustic feature may be determined according to the method described with reference to FIG. 2. In operation 803, the recognition device may divide the acoustic feature for each frequency band interval. For example, the recognition device may divide the acoustic feature for each of a plurality of frequency band intervals, based on human auditory perception characteristics of being insensitive to high-frequency acoustic signals and sensitively responding to low-frequency acoustic signals.

Specifically, the recognition device may divide the acoustic feature as a long frequency band interval with respect to a relatively high frequency and divide the acoustic feature as a short frequency band interval with respect to a relatively low frequency. The recognition device may determine a division number and a division ratio in advance, and divide the acoustic feature into the plurality of frequency band intervals based on the predetermined division number and division ratio.

For example, the recognition device may divide the acoustic feature into the plurality of frequency band intervals according to the division ratio, and may additionally divide the acoustic feature based on the division number. In this case, the additional division process is performed for a lowest frequency band interval of the frequency band intervals. A detailed example of the division process is shown in FIG. 5.

In operation 804, the recognition device may determine the acoustic event or acoustic scene included in the acoustic signal by inputting the divided acoustic features to a trained learning model. The recognition device may obtain an output signal in which the acoustic event or acoustic scene is determined from the learning model by inputting the divided acoustic signal to each neural network model of the learning model.

The trained learning model includes a combinational model and a plurality of neural network models, wherein each of the neural network models is trained to determine an acoustic event or acoustic scene included in the divided acoustic feature, and the combinational model combines output results of the plurality of neural network models.

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The method according to example embodiments may be written in a computer-executable program and may be implemented as various recording media such as magnetic storage media, optical reading media, or digital storage media.

Various techniques described herein may be implemented in digital electronic circuitry, computer hardware, firmware, software, or combinations thereof. The implementations may be achieved as a computer program product, for example, a computer program tangibly embodied in a machine readable storage device (a computer-readable medium) to process the operations of a data processing device, for example, a programmable processor, a computer, or a plurality of computers or to control the operations. A computer program, such as the computer program(s) described above, may be written in any form of a programming language, including compiled or interpreted languages, and may be deployed in any form, including as a stand-alone program or as a module, a component, a subroutine, or other units suitable for use in a computing environment. A computer program may be deployed to be processed on one computer or multiple computers at one site or distributed across multiple sites and interconnected by a communication network.

Processors suitable for processing of a computer program include, by way of example, both general and special purpose microprocessors, and any one or more processors of any kind of digital computer. Generally, a processor will receive instructions and data from a read-only memory or a random-access memory, or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Examples of information carriers suitable for embodying computer program instructions and data include semiconductor memory devices, e.g., magnetic media such as hard disks, floppy disks, and magnetic tape, optical media such as compact disk read only memory (CD-ROM) or digital video disks (DVDs), magneto-optical media such as floptical disks, read-only memory (ROM), random-access memory (RAM), flash memory, erasable programmable ROM (EPROM), or electrically erasable programmable ROM (EEPROM). The processor and the memory may be supplemented by, or incorporated in special purpose logic circuitry.

In addition, non-transitory computer-readable media may be any available media that may be accessed by a computer and may include both computer storage media and transmission media.

Although the present specification includes details of a plurality of specific example embodiments, the details should not be construed as limiting any invention or a scope that can be claimed, but rather should be construed as being descriptions of features that may be peculiar to specific example embodiments of specific inventions. Specific features described in the present specification in the context of individual example embodiments may be combined and implemented in a single example embodiment. On the contrary, various features described in the context of a single embodiment may be implemented in a plurality of example embodiments individually or in any appropriate sub-combination. Furthermore, although features may operate in a specific combination and may be initially depicted as being claimed, one or more features of a claimed combination may be excluded from the combination in some cases, and the claimed combination may be changed into a sub-combination or a modification of the sub-combination.

Likewise, although operations are depicted in a specific order in the drawings, it should not be understood that the operations must be performed in the depicted specific order or sequential order or all the shown operations must be performed in order to obtain a preferred result. In specific cases, multitasking and parallel processing may be advantageous. In a specific case, multitasking and parallel processing may be advantageous. In addition, it should not be understood that the separation of various device components of the aforementioned example embodiments is required for all the example embodiments, and it should be understood that the aforementioned program components and apparatuses may be integrated into a single software product or packaged into multiple software products.

The example embodiments disclosed in the present specification and the drawings are intended merely to present specific examples in order to aid in understanding of the present disclosure, but are not intended to limit the scope of the present disclosure. It will be apparent to those skilled in the art that various modifications based on the technical spirit of the present disclosure, as well as the disclosed example embodiments, can be made.

What is claimed is:

1. A method of recognizing an acoustic signal using a learning model, the method comprising:
   identifying an acoustic signal comprising an acoustic event or acoustic scene;
   determining an acoustic feature of the acoustic signal;
   dividing the determined acoustic feature for each of a plurality of frequency band intervals; and
   determining the acoustic event or acoustic scene included in the acoustic signal by inputting the divided acoustic features to a trained learning model,
   wherein the dividing comprises dividing the acoustic feature into frequency band intervals of different lengths based on a frequency axis of the acoustic feature.

2. The method of claim 1, wherein the determining of the acoustic feature comprises:
   converting the acoustic signal into a frequency domain; and
   generating log Mel-filterbank energy based on the converted acoustic signal.

3. The method of claim 1, wherein the trained learning model comprises a combinational model and a plurality of neural network models, wherein each of the neural network models is trained to determine an acoustic event or acoustic scene included in the divided acoustic feature, and the combinational model is configured to combine output results of the plurality of neural network models.

4. A method of training a learning model for recognizing an acoustic signal, the method comprising:
   identifying an acoustic signal comprising an acoustic event or acoustic scene and a label representing the acoustic event or acoustic scene included in the acoustic signal;
   determining an acoustic feature of the acoustic signal;
   dividing the determined acoustic feature for each of a plurality of frequency band intervals; and
   training the learning model using the acoustic feature divided by each of the plurality of frequency band intervals and the label,
   wherein the dividing comprises dividing the acoustic feature into frequency band intervals of different lengths based on a frequency axis of the acoustic feature.

5. The method of claim 4, wherein the determining of the acoustic feature comprises:
   converting the acoustic signal into a frequency domain; and
   generating log Mel-filterbank energy based on the converted acoustic signal.

6. The method of claim 4, wherein the trained learning model comprises a combinational model and a plurality of neural network models, wherein each of the neural network models is trained to determine an acoustic event or acoustic scene included in the divided acoustic feature, and the combinational model is configured to combine output results of the plurality of neural network models.

7. The method of claim 4, wherein the training of the learning model comprises:
   obtaining an output signal in which the acoustic event or acoustic scene is determined from the learning model by inputting the divided acoustic signal to the learning model; and
   updating weights of the learning model according to a difference between the output signal and the label.

8. A recognition device for performing a method of recognizing an acoustic signal, the recognition device comprising:
   a processor,
   wherein the processor is configured to:
   identify an acoustic signal comprising an acoustic event or acoustic scene,
   determine an acoustic feature of the acoustic signal,
   divide the determined acoustic feature for each of a plurality of frequency band intervals, and
   determine the acoustic event or acoustic scene included in the acoustic signal by inputting the divided acoustic features to a trained learning model, wherein the processor is further configured to divide the acoustic feature into frequency band intervals of different lengths based on a frequency axis of the acoustic feature.

9. The recognition device of claim 8, wherein the processor is further configured to convert the acoustic signal into a frequency domain, and generate log Mel-filterbank energy based on the converted acoustic signal.

10. The recognition device of claim 8, wherein the trained learning model comprises a combinational model and a plurality of neural network models, wherein each of the neural network models is trained to determine an acoustic event or acoustic scene included in the divided acoustic feature, and the combinational model is configured to combine output results of the plurality of neural network models.

* * * * *